(12) United States Patent
Chiu et al.

(10) Patent No.: US 7,856,108 B2
(45) Date of Patent: Dec. 21, 2010

(54) METHOD FOR PREVENTING AN OUTPUT DEVICE FROM BEING DAMAGED

(75) Inventors: Yi-Wei Chiu, Taipei (TW); Cheng-I Chien, Taipei (TW)

(73) Assignee: Compal Electronics, Inc., Neihu, Taipei (TW)

( * ) Notice: Subject to any disclaimer, the term of this patent is extended or adjusted under 35 U.S.C. 154(b) by 1413 days.

(21) Appl. No.: 11/295,665

(22) Filed: Dec. 7, 2005

(65) Prior Publication Data
US 2007/0036362 A1   Feb. 15, 2007

(30) Foreign Application Priority Data
Aug. 12, 2005   (TW) ............................... 94127516 A

(51) Int. Cl.
*H03G 7/00* (2006.01)
*H03G 3/00* (2006.01)
*H04R 29/00* (2006.01)

(52) U.S. Cl. .................. 381/106; 381/55; 381/104; 381/107

(58) Field of Classification Search .................. 381/104, 381/106, 107, 55
See application file for complete search history.

(56) References Cited

U.S. PATENT DOCUMENTS
5,396,562 A * 3/1995 Ishimitsu et al. ............ 381/107

* cited by examiner

*Primary Examiner*—Vivian Chin
*Assistant Examiner*—Douglas J Suthers
(74) *Attorney, Agent, or Firm*—Ming Chow; Sinorica, LLC

(57) ABSTRACT

The present invention relates to a method for preventing an output device from being damaged, which comprises the steps of: dividing the output value of an output device into a plurality of areas, defining a ratio value to every area, receiving a desired output value, determining the current area where the desired output value device is located, and calculating the desired output value with the ratio value to obtain an actual output volume and output the actual output volume.

8 Claims, 6 Drawing Sheets

US 7,856,108 B2

METHOD FOR PREVENTING AN OUTPUT DEVICE FROM BEING DAMAGED

BACKGROUND OF THE INVENTION

1. Field of the Invention

The present invention relates to a method for preventing an output device from being damaged, and more particularly to a method for preventing a loudspeaker from being damaged by an excessively large volume.

2. Description of the Related Art

In general, an output device such as a loudspeaker usually bears a limitation of a maximum output volume, and thus it is necessary to avoid outputting a signal that exceeds the maximum output volume to a loudspeaker, so as to prevent the loudspeaker from being burned or damaged. Referring to FIG. 1 for the schematic view of a prior art loudspeaker bearing a maximum output volume, the waveform is a waveform of the original desired output volume of the loudspeaker, and the y-axis represents a percentage of the output volume of the loudspeaker, and the x-axis represents time. If the loudspeaker can bear a maximum output volume equal to 55% of the output volume of the loudspeaker, then any volume exceeding 55% will damage the loudspeaker.

Refer to FIG. 2 for the schematic view of a prior art method of using software to control the output volume of a loudspeaker and eliminate its maximum output volume. In the prior art, software is used directly to eliminate a volume that exceeds the maximum output volume of the loudspeaker to prevent the loudspeaker from being damaged, and its results are shown in FIG. 2. However, the sound produced by this method will be distorted since the sound with a larger volume cannot be heard.

SUMMARY OF THE INVENTION

The primary objective of the present invention is to provide a method for adjusting the corresponding relation between the desired output volume and the actual output volume of a loudspeaker, so as to prevent the loudspeaker from being damaged by an excessively large volume.

Another objective of the present invention is to provide a control of volume by means of a method for preventing an output device from being damaged real time.

A further objective of the present invention is to provide a partial change of the volume for preventing the sound from being distorted when the volume is low.

To achieve the foregoing objectives, the output device is set up in a system, and the system includes a processor, and the method for preventing an output device from being damaged in accordance with the present invention comprises the following steps: output values of the output device are divided into a plurality of areas; a ratio value is defined for each area; the processor receives a desired output value; a current area where the desired output value is located is determined from the areas; and the desired output value and the ratio value of the corresponding current area are calculated to obtain an actual output volume, and the output device outputs the actual output volume, wherein the actual output volume is lower than the maximum output volume permitted by the output device, so as to prevent the output device from being damaged.

To achieve the foregoing objectives, the output device is set up in a system, and the system includes a processor, and the method of preventing an output device from being damaged in accordance with the present invention comprises the following steps: the processor divides the output values of the output device into a plurality of areas; a ratio value is defined for each area, and the ratio values are arranged in an ascending order; the processor receives a desired output value; the processor determines a mapping area where a converted maximum output value of a previous predetermined time is located from the areas; the processor determines a current area where the desired output value is located from the areas; and the processor determines whether or not the ratio value of the current area is larger than the ratio value of the mapping area, if yes, then the processor calculates the desired output value with a substantially non-distorted ratio value to obtain a first actual output volume, and the output device outputs the first actual output volume, wherein the substantially non-distorted ratio value is larger than the ratio value of the current area, and the mapping area having the substantially non-distorted ratio value is situated adjacent to the current area; and if no, then the processor calculates the desired output value with the ratio value of the current area to obtain a second actual output volume, and the output device outputs the second actual output volume, wherein the second actual output volume is lower than the maximum output volume permitted by the output device to prevent the output device from being damaged.

According to the concept above, the output device is a loudspeaker, and the output value of the loudspeaker is volume.

According to the concept above, the output values of the output device are divided into a first area, a second area, and a third area.

According to the concept above, the first area is defined as an area falling into 0~50% of the output value of the output device, and the second area is defined as an area falling into 50~70% of the output value of the output device, and the third area is defined as an area falling into 70~100% of the output value of the output device.

According to the concept above, the ratio value of the first area is 1, and the ratio value of the second area is 6/7, and the ratio value of the third area is 7/10.

According to the concept above, the processor multiples the desired output value with the ratio value corresponding to the current area to obtain the actual output volume.

According to the concept above, said processor multiples a substantially non-distorted ratio value with said desired output value to obtain said first actual output volume According to the concept above, a storage unit of the system stores a plurality of converted output values in a previous predetermined time in advance, and the processor determines the maximum output value from the converted output values.

Compared with the prior art, the present invention uses the processor to divide the desired output volume into a plurality of areas and defines the corresponding ratio values. The present invention can be used to reduce the desired output volumes corresponding to different areas by different ratios, so that when the desired output volume of the loudspeaker is larger than the maximum output volume permitted by the loudspeaker, the desired output volume can be reduced and outputted after being multiplied by a ratio value. Therefore, the present invention can overcome the shortcomings of the prior art that a larger volume cannot be heard or the sound is distorted.

To make it easier for our examiner to understand the objective of the invention, its structure, innovative features, and performance, we use a preferred embodiment together with the attached drawings for the detailed description of the invention.

DETAILED DESCRIPTION OF THE PREFERRED EMBODIMENTS

Figure 1:
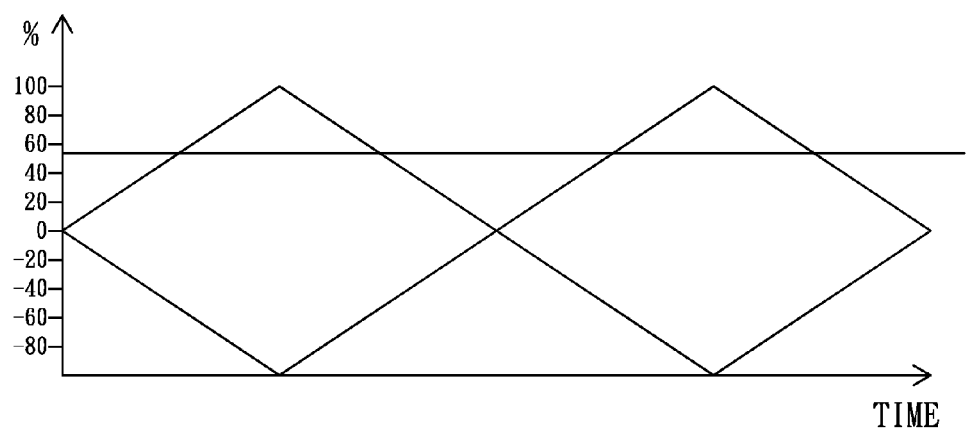
FIG. 1 is a schematic view of a prior art loudspeaker bearing a maximum output volume.
Figure 2:
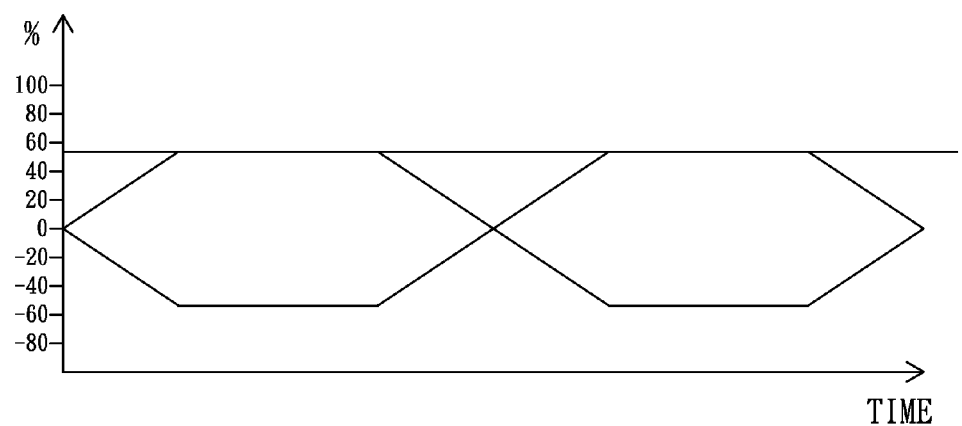
FIG. 2 is a schematic view of a prior art method of using software to control the output volume of a loudspeaker and eliminate its maximum output volume.
Figure 3:
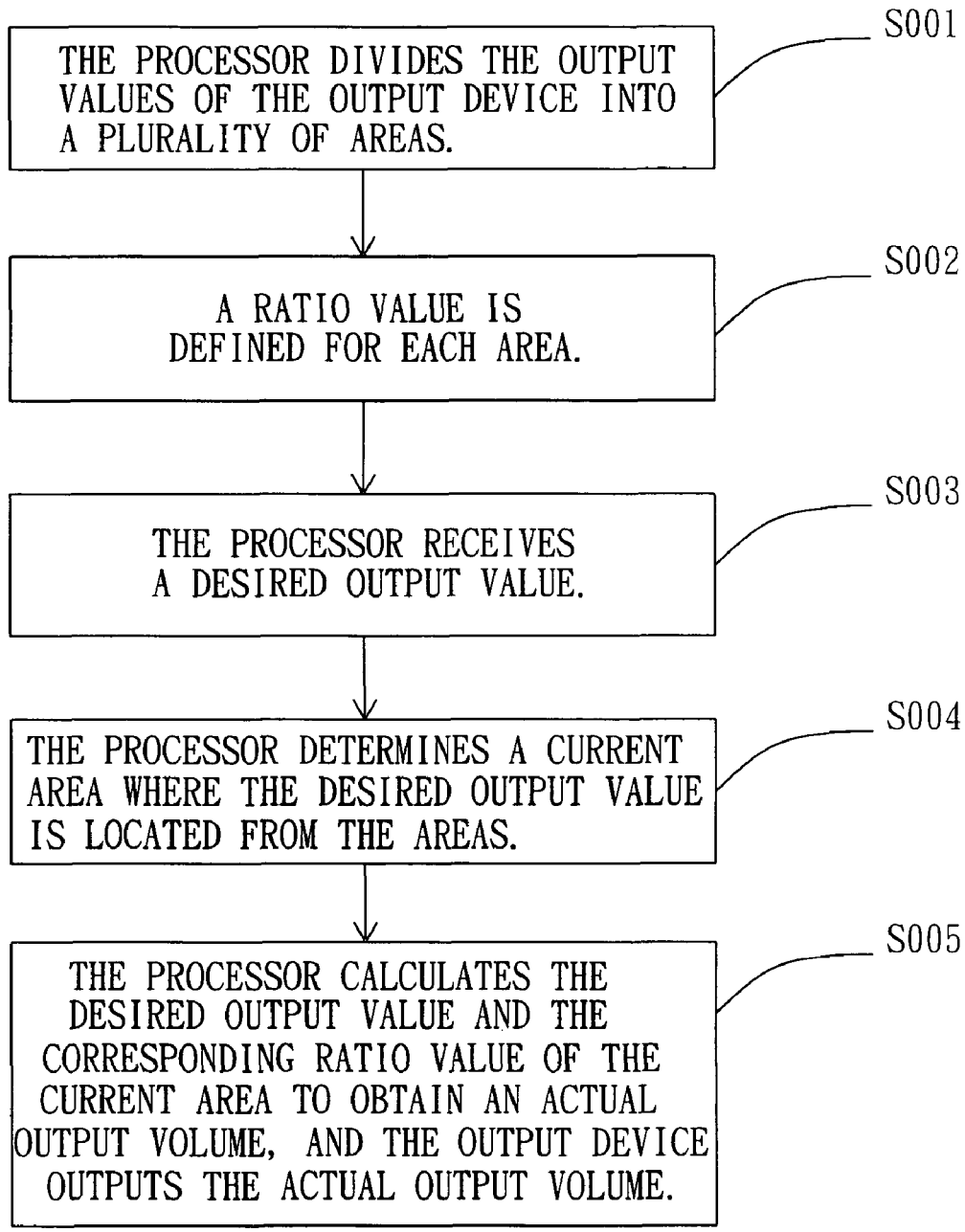
FIG. 3 is a flow chart of a method for preventing an output device from being damaged according to a preferred embodiment of the present invention.

Referring to FIG. 3 for the flow chart of a method for preventing an output device from being damaged according to a preferred embodiment of the present invention, an output device is set up in a system, and the system includes a processor, and the method for preventing an output device from being damaged comprises the following steps: The processor divides the output values of the output device into a plurality of areas (Step S001); a ratio value is defined for each area (Step S002); the processor receives a desired output value (Step S003), the processor determines a current area where the desired output value is located from the areas (Step S004); and the processor calculates the desired output value and the corresponding ratio value of the current area to obtain an actual output volume, and the output device outputs the actual output volume (Step S005).

The actual output volume is lower than the maximum output volume permitted by the output device to prevent the output device from being damaged.

In Step S001, the output device is but not limited to a loudspeaker. The loudspeaker is used for description only, but it is not intended to limit the application of the present invention, and the output value of the loudspeaker is volume, and Step S001 divides the output values of the loudspeaker into a plurality of areas.

Figure 4:
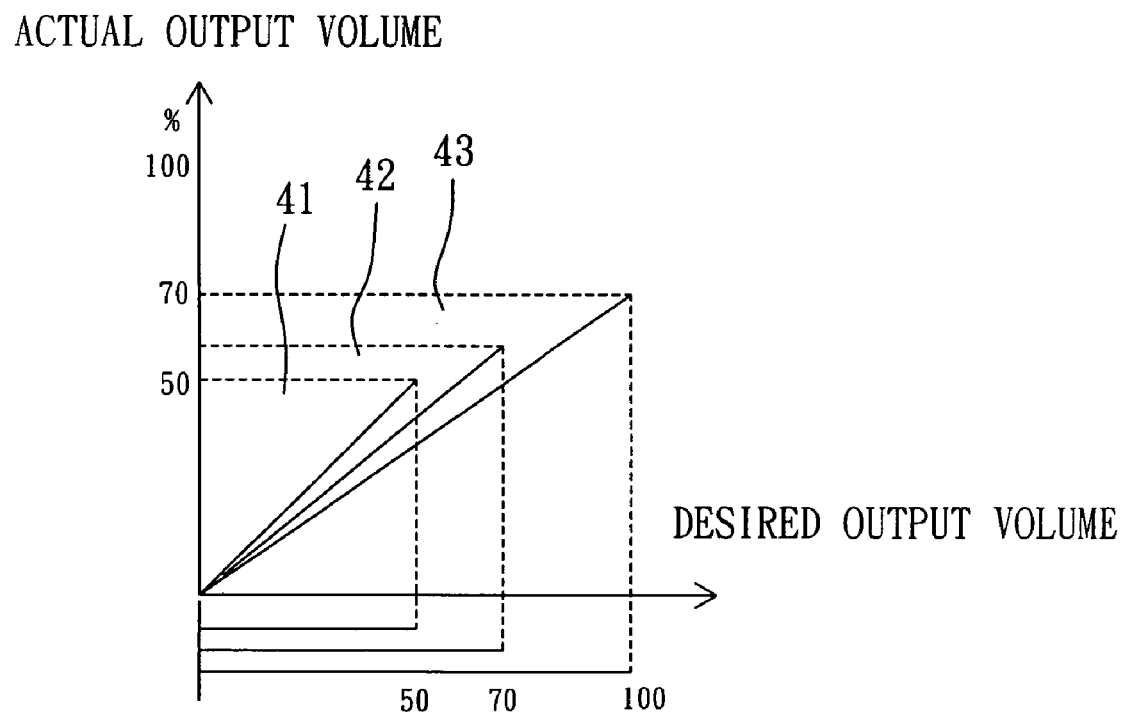
FIG. 4 is a schematic view of dividing the output value of the loudspeaker into three areas according to the present invention.

Referring to FIG. 4 for the schematic view of dividing the output value of the loudspeaker into three areas according to the present invention, Step (S001) divides the output values of the loudspeaker into a first area 41, a second area 42, and a third area 43, wherein the first area 41 is defined as an area falling into 0~50% of the output value of the loudspeaker, and the second area 42 is defined as an area falling into 51~70% of the output value of the loudspeaker, and the third area 43 is defined as an area falling into 71~100% of the output value of the loudspeaker.

Figure 5A:
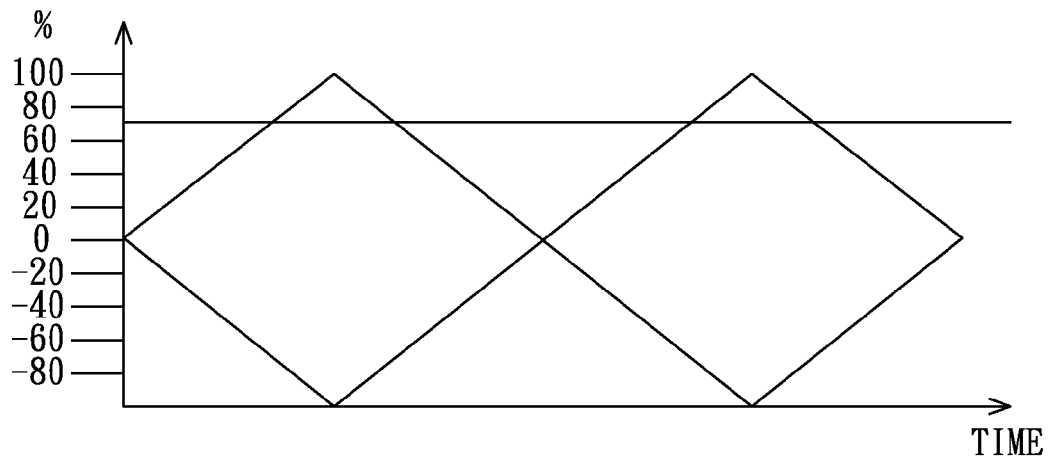
FIGS. 5a and 5b are schematic views of the waveforms of the original desired output volume and the actual output volume of the loudspeaker according to the present invention.

In Step S002, a ratio value is defined for each area, and the ratio value is a reduced ratio value, and the first area 41 is used as a base, and other areas are reduced according to the base as shown in FIG. 4. The reduced ratio value of the first area 41 is 1 (the slope of the area is 1), the reduced ratio value of the second area 42 is 6/7, and the reduced ratio value of the third area 43 is 7/10. To significantly increase the volume, the present invention adopts 50%, 70%, and 100% for these three volume areas 41, 42, 43, when the corresponding actual output volumes of the loudspeaker are 50%, 60%, and 70% respectively, and the maximum output volume permitted by the loudspeaker is 70% as shown in FIG. 5a. In other words, if it is necessary to output a volume of 50% from the loudspeaker, then the loudspeaker will actually output a volume of 50%. If it is necessary to output a volume of 70% from the loudspeaker, then the loudspeaker will actually output a volume of 70%×6/7=60%. If it is necessary to output a volume of 100% from the loudspeaker, then the loudspeaker will actually output a volume of 100%×7/10=70%. Even if a user turns the volume knob (not shown in the figure) to the maximum volume by accident, the control mechanism of the present invention will actually output a volume of 70% from the loudspeaker, and thus the loudspeaker will not be burn or damaged.

In Step S003, the processor receives the desired output value, and the desired output value is an output volume of the loudspeaker.

In Step S004, the processor determines a current area where the desired output is located from a first area 41, a second area 42, and a third area 43. According to the definition of step S001, if the desired output value is 45%, then the current area is determined as the first area 41; if the desired output value is 63%, then the current area is determined as the second area 42; and if the desired output value is 80%, then the current area is determined as the third area 43.

In Step S005, the processor calculates the desired output value and the corresponding ratio value of the current area to obtain an actual output volume, and the output device outputs the actual output volume. According to the description of Step S004, if the output value is 45%, then the current area is determined to be in the first area 41, and thus the actual output volume is 45%×1=45%. If the desired output value is 63%, then the actual output volume is 63%×6/7=54%. If the desired output value is 80%, then the actual output volume is 80%×7/10=56%.

through Steps S003 to S005, it is known that if any one of the desired output values shows up, the desired output value is used for the determination and calculation. It is not necessary to determine and calculate the desired output volume after receiving the whole music, and thus the present invention can achieve the effect of controlling the volume real time.

Figure 5B:
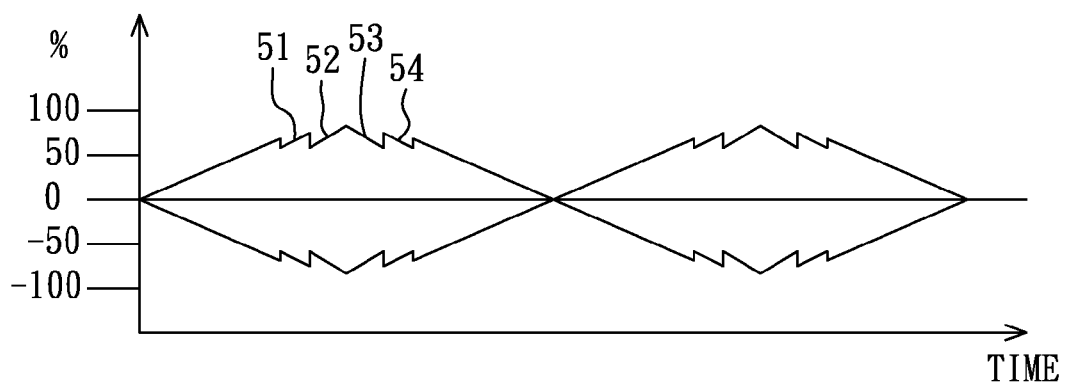

Refer to FIGS. 5a and 5b for the waveform diagram of the desired output values of the present invention and the waveform diagram of the actual output volume of the loudspeaker of the present invention. In FIG. 5a, if the maximum output permitted by the loudspeaker is 70%, then the portion of volume exceeding 70% will be eliminated to prevent the loudspeaker from being burned or damaged. In FIG. 5b, if the desired output value is 50%, then the actual output volume is 50%×1=50%, and thus the output volume of the loudspeaker will not be reduced. If the desired output value falls into the range of 50%~70%, then the actual output volume is (50%~70%)×6/7 which is expressed as the first sawtooth wave portion 51. If the desired output value falls into the range of 70%~100%, then the actual output volume is (70%~100%)×7/10 which is expressed as the second sawtooth wave portion 52, and the maximum actual output volume of the loudspeaker is situated precisely at the position of 70%, and thus the loudspeaker will not be burned or damaged. If the desired output volume of the loudspeaker gradually becomes smaller, then the third sawtooth wave portion 53 and the fourth sawtooth wave portion 54 will show up similarly, wherein the first sawtooth wave portion 51 and the fourth sawtooth wave portion 54 are symmetrical, and the second sawtooth wave portion 52 and the third sawtooth wave portion 53 are symmetrical. Therefore, the method of the present invention can prevent the loudspeaker from being damaged by an excessively large volume, and can control the volume real time and partially change the volume, so as to maintain a small volume from being distorted. The present invention surely can overcome the shortcomings of the prior art that adopts the method of using software to control the output volume of the loudspeaker.

Figure 6:
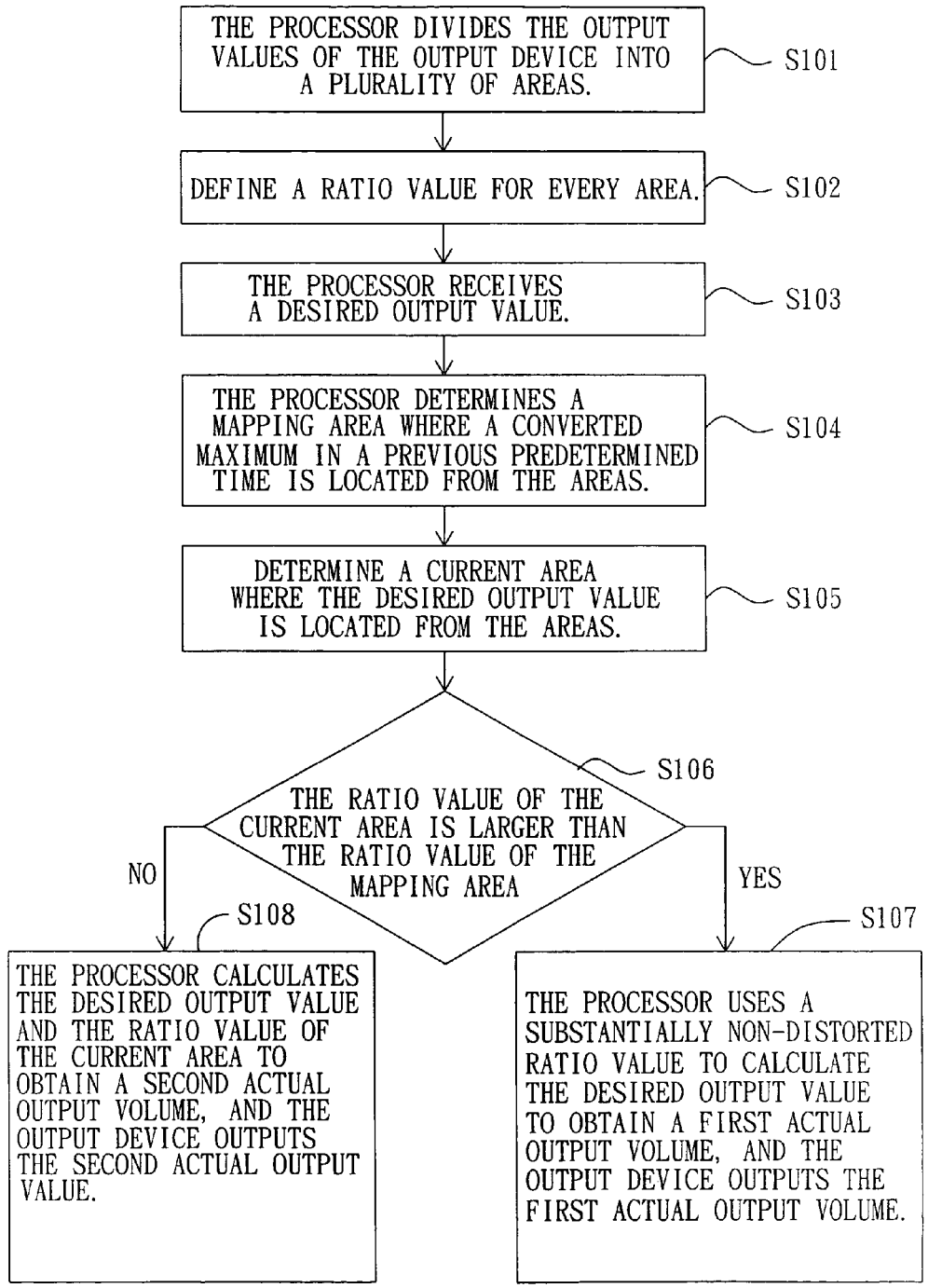
FIG. 6 is a flow chart of a method for preventing an output device from being damaged according to another preferred embodiment of the present invention.

Referring to FIG. 6 for the flow chart of a method for preventing an output device from being damaged according to another preferred embodiment of the present invention, an output device is set up in a system, and the system includes a processor, and the method for preventing an output device from being damaged comprises the following steps: The processor divides the output values of the output device into a plurality of areas (Step S101); a ratio value is defined for each ratio value (Step S102), wherein the ratio values are arranged in ascending order; the processor receives a desired output value (Step S103); the processor determines a mapping area where a converted maximum output value within a first predetermined time is located from the areas (Step 104); the processor determines a current area where the desired output value is located from the areas (Step S105); and the processor determines whether or not the ratio value of the current area is larger than the ratio value of the mapping area (Step S106), if yes, then the processor will use a substantially non-distorted ratio value to calculate the desired output value to obtain a first actual output volume, and the output device outputs the first actual output volume (Step S107), wherein the substantially non-distorted ratio value is larger than the ratio value of the current area, and the mapping area having the substantially non-distorted ratio value is situated adjacent to the current area; if no, then the processor will calculate the desired output value and the ratio value of the current area to obtain a second actual output volume, and the output device outputs the second actual output volume (Step S108), wherein the second actual output volume is lower than the maximum output volume permitted by the output device to prevent the output device from being damaged.

In Step S101, the output device is but not limited to a loudspeaker. The loudspeaker is used for the illustration below, but is not intended to limit the applications of the present invention. The output value of the loudspeaker is volume, and Step S101 divides the output values of the loudspeaker into a plurality of areas. In FIG. 4, the present invention divides the output values of the loudspeaker into a first area 41, a second area 42, and third area 43, wherein the first area 41 is defined as an area falling into 0~50% of the output value of the loudspeaker, and the second area 42 is defined as an area falling into 51~70% of the output value of the loudspeaker, and the third area 43 is defined as an area falling into 71~100% of the output value of the loudspeaker.

In Step S102, a ratio value is defined for each area, and the ratio value is a reduced ratio value, and the reduced ratio value of the first area 41 is 1 (the slope of the area is 1), and the reduced ratio value of the second area 42 is 6/7, and the reduced ratio value of the third area 43 is 7/10.

In Step S103, the processor receives a desired output value, and the desired output value is volume.

In Step S104, a storage unit of the system stores a plurality of converted output values in the predetermined time such as 5 minutes, and the five output values in the first five minutes are 45%, 71%, 50%, 45%, and 43%, and then the processor determines the maximum output value of the five converted output values, and the maximum output value in this case is 71%.

The processor determines a mapping area where the converted maximum output value is located from the first area 41, second area 42, and third area 43 within the first five minutes. Since 71% falls into the third area 43, the mapping area is the third area 43.

In Step S105, the processor determines a current area where the desired output value is located from a first area 41, a second area 42, and a third area 43. If the desired output value is 63%, then the current area is determined to be in the second area 42.

In Step S106, the processor determines whether or not the ratio value of the current area is larger than the ratio value of the mapping area. According to the previous description, the ratio value of the second area 42 (which equals to 6/7) is larger than the ratio value of the third area 43 (which equals to 7/10).

In Step S107, the substantially non-distorted ratio value is larger than the ratio value of the second area 42, and the mapping area having a substantially non-distorted ratio value is situated adjacent to the second area 42. Therefore, the substantially non-distorted ratio value is 1, and the mapping area having the substantially non-distorted ratio value is the first area 41. The processor multiplies the substantially non-distorted ratio value with the desired output value, which is 1×63%=63% to obtain the first actual output volume (63%) and the loudspeaker outputs a volume of 63%.

In Step S108, if the five output values within the first five minutes as described in Step S104 are 45%, 49%, 46%, 45% and 43%, the maximum output value will be 49%, and thus the ratio value of the current area is smaller than the ratio value of the mapping area. Then, the processor multiplies the desired output value with the corresponding ratio value of the current area to obtain the second actual output volume, and the loudspeaker outputs the second actual output volume. The second actual output volume is 63%×6/7=54%. Finally, the loudspeaker outputs a volume of 63%.

If the ratio value of the current area is larger than the ratio value of the mapping area, then the output volume of the music from the loudspeaker continues dropping, and thus a substantially non-distorted ratio value should be used to calculate the desired output value, so as to maintain to prevent the sound of small volume from being distorted.

With the present invention, the corresponding relation between the desired output volume and the actual output volume of the loudspeaker is adjusted to prevent the loudspeaker from being damaged by an excessively large volume and promptly control the volume and partially change the volume, so as to maintain the sound of small volume from being distorted and overcome the shortcomings of a prior art method that uses software to control the output volume of the loudspeaker.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A method for preventing an output device from being damaged, said output device being set up to a system, and said system including a processor, and said method comprising the steps of:
   (a) said processor dividing output values of said output device into a plurality of areas;
   (b) defining a ratio for said each area, and said ratio values are arranged in an ascending order;
   (c) said processor receiving a desired output value;
   (d) said processor determining a mapping area where a converted maximum output value within a previous predetermined time is located from said areas;
   (e) determining a current area where said desired output value is located from said areas; and
   (f) determining whether or not said ratio value of said current area is larger than said ratio value of said mapping area;
   if yes, then said processor will use a substantially non-distorted ratio value to calculate said desired output value to obtain a first actual output volume, and said output device will output said first actual output volume, wherein said substantially non-distorted ratio value is larger than said ratio value of said current area, and said mapping area having said substantially non-distorted area is situated adjacent to said current area;
   if no, then said processor will calculate said desired output value and said ratio value of said current area to obtain a second actual output volume, and said output device will output said second actual output volume, wherein said second actual output volume is lower than said maximum output volume permitted by said output device to prevent said output device from being damaged.

2. The method for preventing an output device from being damaged of claim 1, wherein said output device is a loudspeaker, and said output value of said loudspeaker is volume.

3. The method for preventing an output device from being damaged of claim 1, wherein said Step (d) further comprising:
   (d1) a storage unit of said system saving a plurality of converted output values in said predetermined time; and
   (d2) said processor determining said maximum output value from said converted output values.

4. The method for preventing an output device from being damaged of claim 1, wherein said output values of said output device are divided into a first area, a second area, and a third area.

5. The method for preventing an output device from being damaged of claim 4, wherein said first area is defined an area falling into 0~50% of said output value of said output device, said second area is defined as an area falling into 50~70% of said output value of said output device, and said third area is defined as an area falling into 70~100% of said output value of said output device.

6. The method for preventing an output device from being damaged of claim 5, wherein said ratio value of said first area is 1, said ratio value of said second area is 6/7, and said ratio value of said third area is 7/10.

7. The method for preventing an output device from being damaged of claim 1, wherein said step (f) further comprises the step of: said processor multiplying a substantially non-distorted ratio value with said desired output value to obtain said first actual output volume.

8. The method for preventing an output device from being damaged of claim 1, wherein said step (f) further comprises the step of: said processor multiplying said desired output value with the corresponding ratio value of said current area to obtain said second actual output volume.

* * * * *